United States Patent
Logan

(10) Patent No.: US 7,786,750 B2
(45) Date of Patent: Aug. 31, 2010

(54) METHODS AND APPARATUS FOR COMPENSATING FOR SKEW IN A DIFFERENTIAL SIGNAL USING NON-COMPLEMENTARY INVERTERS

(75) Inventor: Shawn M Logan, Andover, MA (US)

(73) Assignee: Agere Systems Inc., Allentown, PA (US)

( * ) Notice: Subject to any disclaimer, the term of this patent is extended or adjusted under 35 U.S.C. 154(b) by 0 days.

(21) Appl. No.: 11/686,795

(22) Filed: Mar. 15, 2007

(65) Prior Publication Data

US 2008/0231394 A1 Sep. 25, 2008

(51) Int. Cl.
*H03K 17/16* (2006.01)
(52) U.S. Cl. .............................. 326/26; 326/27; 326/86; 327/293
(58) Field of Classification Search ............... 326/26, 326/27, 115, 121, 127; 327/108, 109, 112, 327/170, 171
See application file for complete search history.

(56) References Cited

U.S. PATENT DOCUMENTS

| | | | | |
|---|---|---|---|---|
| 5,852,378 | A * | 12/1998 | Keeth | 327/171 |
| 6,069,510 | A * | 5/2000 | Keeth | 327/170 |
| 6,828,866 | B2 * | 12/2004 | Liu | 331/57 |
| 6,920,187 | B2 * | 7/2005 | Penney | 375/316 |
| 7,119,602 | B2 | 10/2006 | Davis | |
| 7,352,204 | B2 * | 4/2008 | Frisch | 326/26 |
| 2005/0068114 | A1 * | 3/2005 | Liu | 331/57 |
| 2006/0244505 | A1 * | 11/2006 | Fung et al. | 327/293 |
| 2007/0164802 | A1 * | 7/2007 | Rea et al. | 327/266 |

OTHER PUBLICATIONS

Kobchai Dejhan et al., 1V, High Speed, Full Swing Non-complementary BiCMOS Inverter Circuit Using Feedback Scheme, 2002 IEEE, pp. 271-274.*
Mark Horowitz, "Scaling, Power and the Future of CMOS," http://www-vlsi.stanford.edu/papers/mh_iedm_05.ppt (Dec. 1, 2005).
http://en.wikipedia.org/wiki/CMOS, (Jul. 9, 2008).
Howard Johnson and Martin Graham, "High-Speed Digital Design," Table 2.1 (Prentice Hall, 1993).

* cited by examiner

*Primary Examiner*—Vibol Tan
(74) *Attorney, Agent, or Firm*—Ryan, Mason & Lewis, LLP

(57) ABSTRACT

Methods and apparatus are provided for compensating for skew in a differential signal using non-complementary inverters. A skew attenuator is provided for a differential signal having a P rail and an N rail. The skew attenuator comprises one or more non-complementary inverters for compensating for skew between the P rail and the N rail. The non-complementary inverters attenuate a time difference of arrival of transitions for the P rail and the N rail. An exemplary skew attenuator includes a first non-complementary inverter associated with each of the P rail and the N rail. The P rail and the N rail signals are each applied to a gate of one of the first non-complementary inverters, and drains of the first non-complementary inverters provide differential output signals OUTP and OUTN. The exemplary skew attenuator also includes an additional non-complementary inverter associated with each of the first non-complementary inverters.

20 Claims, 11 Drawing Sheets

1300

| CLKINP AND CLKINN INPUT LOGIC STATES | CLKOUTP LOGIC OUTPUT LEVEL |
|---|---|
| CLKINP > Vth, CLKINN > Vth OR CLKINP ≤ Vth, CLKINN ≤ Vth | $IO * \left[\dfrac{R * RO}{R + RO}\right] = IO * \left[\dfrac{Rn * RO}{Rn + RO}\right] \approx IO * Rn$ |
| CLKINP ≤ Vth, CLKINN ≥ Vth | $V_{DD}$ |
| CLKINP > Vth, CLKINN < Vth | $IO * R = IO * Rn/2$ |

1600

1650

METHODS AND APPARATUS FOR COMPENSATING FOR SKEW IN A DIFFERENTIAL SIGNAL USING NON-COMPLEMENTARY INVERTERS

FIELD OF THE INVENTION

The present invention relates to skew compensation techniques for differential signals, and more particularly, to methods and apparatus for compensating for skew in differential signals using non-complementary inverters.

BACKGROUND OF THE INVENTION

Differential signaling techniques are often employed to reduce the impact of noise on the clock or data signals that are distributed among various blocks on an integrated circuit. Differential signaling techniques transmit information over pairs of wires to reduce the noise on a connection by rejecting common-mode interference. Typically, two wires are routed in parallel so that they will receive the same interference. One wire, often referred to as the "P" rail, carries the signal, and the other wire often referred to as the "N" rail, carries a complementary version of the signal, so that the sum of the voltages on the two wires is always constant. The receiver processes the difference between the two signals.

Differential skew between the P and N rails can result due to slight mismatches in the circuit paths of the P and N rails. Differential skew can cause circuit malfunction. A number of techniques have been proposed or suggested to reduce differential skew. One well-known technique for attenuating differential skew employs an "enforcer" style differential buffer. For a detailed discussion of an exemplary "enforcer" style differential buffer, see, for example, U.S. Pat. No. 7,119,602, incorporated by reference herein. Generally, an "enforcer" style differential buffer connects a first relatively small CMOS inverter with its input to the P rail and its output to the N rail of a differential buffer output and a second small CMOS inverter with its input to the N rail and its output to the P rail of the same differential buffer output.

While "enforcer" style differential buffers can effectively reduce the differential skew for many applications, it has been found that such "enforcer" style differential buffers do not attenuate significant amounts of differential skew unless the two CMOS inverters connected between the P and N rails forming the output are significantly larger than the sizes of the differential buffer itself. In addition, "enforcer" style differential buffers induce switching noise on the power supply and ground nodes. Supply and ground noise is manifested as a source of added phase jitter to the output differential signal. The added phase jitter degrades signal integrity which degrades device performance or causes circuit malfunction.

A need therefore exists for improved techniques for attenuating differential skew that occurs in differential signals. A further need exists for differential skew attenuation techniques that allow for a greater range of skew attenuation than the above-described conventional "enforcer" style differential buffers.

SUMMARY OF THE INVENTION

Generally, methods and apparatus are provided for compensating for skew in a differential signal using non-complementary inverters. According to one aspect of the invention, a skew attenuator is provided for a differential signal having a P rail and an N rail. The skew attenuator comprises one or more non-complementary inverters for compensating for skew between the P rail and the N rail. The non-complementary inverters may comprise, for example, a current source driving one or more NMOS devices or PMOS devices, or a resistive load connected to a drain of one or more NMOS devices or PMOS devices. The non-complementary inverters attenuate a time difference of arrival of transitions for the P rail and the N rail.

An exemplary skew attenuator includes a first non-complementary inverter associated with each of the P rail and the N rail. The P rail and the N rail signals are each applied to a gate of one of the first non-complementary inverters, and drains of the first non-complementary inverters provide differential output signals OUTP and OUTN. The exemplary skew attenuator also includes an additional non-complementary inverter associated with each of the first non-complementary inverters.

In one embodiment, the additional non-complementary inverters have a gate connected to the differential output signals for an opposite rail and a drain connected to the differential output signals for a same rail, wherein a first of the additional non-complementary inverter provides feedback between the output signal OUTP to a node OUTN and wherein a second of the additional non-complementary inverter provides feedback between the output signal OUTN to a node OUTP. In one variation, an inverted version of an opposite one of the P rail and the N rail signals, such as an output of an opposite one of the P rail and the N rail signals, is applied to a gate of each of the additional non-complementary inverters such that a first of the additional non-complementary inverter provides feedback between the output signal OUTP to a node OUTN and wherein a second of the additional non-complementary inverter provides feedback between the output signal OUTN to a node OUTP.

A more complete understanding of the present invention, as well as further features and advantages of the present invention, will be obtained by reference to the following detailed description and drawings.

DETAILED DESCRIPTION

The present invention provides improved techniques for attenuating differential skew in differential signals.

Differential Signaling

In many integrated circuits, the distribution of internal clock and data signals poses a significant design challenge. As a result of the inherent trace series resistance and capacitive coupling between circuit traces, the signal integrity of a clock or data signal waveform can be severely compromised. In addition, the presence of power supply and ground noise as a result of external and internal noise sources results in undesirable phase modulation or jitter that further degrade clock and data signal integrity.

Figure 1:
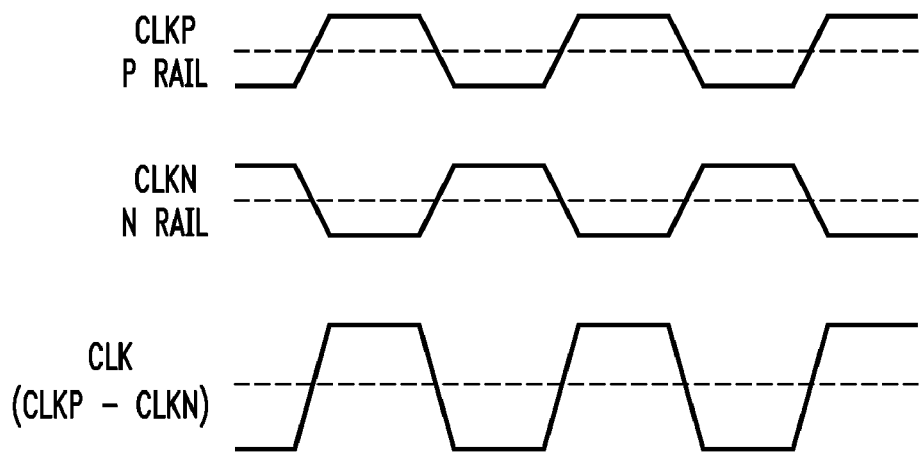
FIG. 1 illustrates an exemplary differential clock signal, CLK, comprised of a P rail signal, CLKP, and an N rail signal, CLKN.

To counteract some of these effects, many integrated circuits utilize differential signaling techniques. Differential signals are composed of a P rail component and a complementary N rail component. FIG. 1 illustrates an exemplary differential clock signal, CLK, comprised of a P rail signal, CLKP, and an N rail signal, CLKN. If similar noise components exist on the P rail signal as on the N rail signal, the noise on the CLK signal composed of the difference between the P rail and N rail signals is eliminated. In practice, however, the resulting noise is not totally eliminated as a result of mismatch between the components creating the P and N rail signal components.

Figure 2:
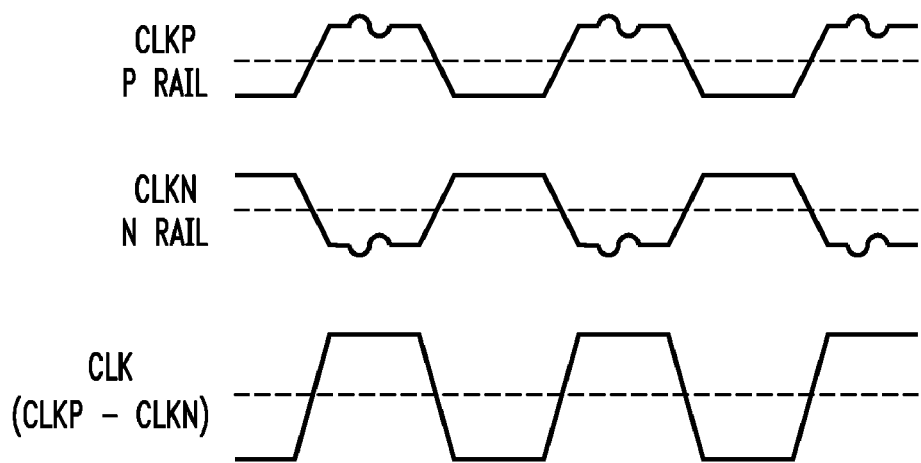
FIG. 2 illustrates the differential signal, CLK, of FIG. 1 in the presence of similar signal disturbances on the P rail, CLKP, and the N rail, CLKN.

FIG. 2 illustrates the differential signal, CLK, of FIG. 1 in the presence of similar signal disturbances on the P rail, CLKP, and the N rail, CLKN. As shown in FIG. 2, if an adjacent signal capacitively couples into both the P rail and the N rail of a differential signal equally, the impact of the coupling is observed to be minimal on the resulting differential signal.

In some applications, the amplitudes of the P rail and N rail signals are chosen to be significantly less than the supply voltage of the integrated circuit. For example, a Low Voltage Differential Signaling (LVDS) technology signal consists of a P rail and an N rail with nominal logic low and high amplitudes of 1.00 V and 1.40 V, respectively. In a device with a supply voltage of 2.50 V or 3.30 V, an LVDS technology signal cannot be processed by a standard CMOS logic gate and typically interfaces with an appropriately biased differential amplifier. In other applications, however, the differential signal rails have signal amplitudes that extend from the minimum supply voltage ($V_{SS}$) to the maximum supply voltage ($V_{DD}$) Each of the two signal rails, therefore, represents a conventional CMOS logic signal with a logic threshold of ($V_{DD}$-$V_{SS}$)/2.

Differential Signal Skew

Figure 3:
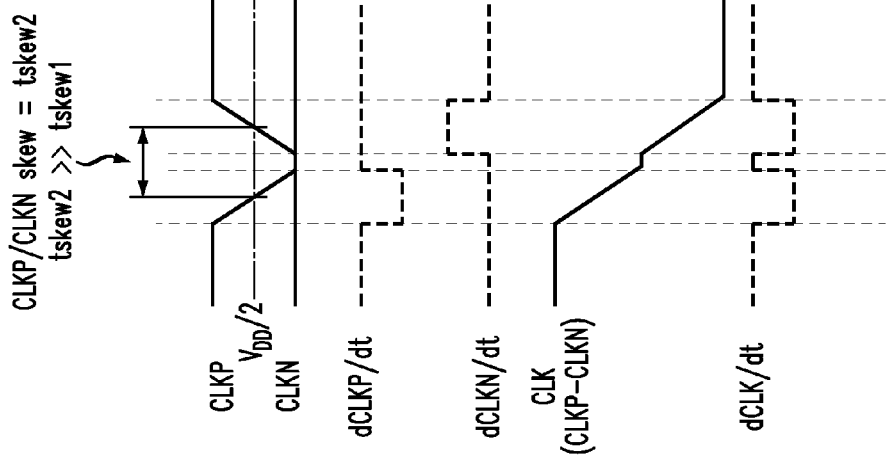
FIG. 3 illustrates the positive and negative transition times of the P and N rails of the signal CLK crossing the voltage threshold at the same time as well as the slope of the CLKP and CLKN signal rails and the resulting differential signal CLK and its slope.

The use of differential signaling requires that the complementary transitions of the P and N rail signals occur simultaneously. FIG. 3 illustrates the positive and negative transition times of the P and N rails of the signal CLK crossing the voltage threshold of their technology at the same instant in time (for an exemplary threshold of $V_{DD}/2$). FIG. 3 also illustrates the slope of the CLKP and CLKN signal rails, as well as the resulting differential signal CLK and its slope. For the differential signal, CLK, FIG. 3 illustrates a region of 0 slope, followed by a region of decreasing slope, followed by another region of 0 slope.

Figure 4:
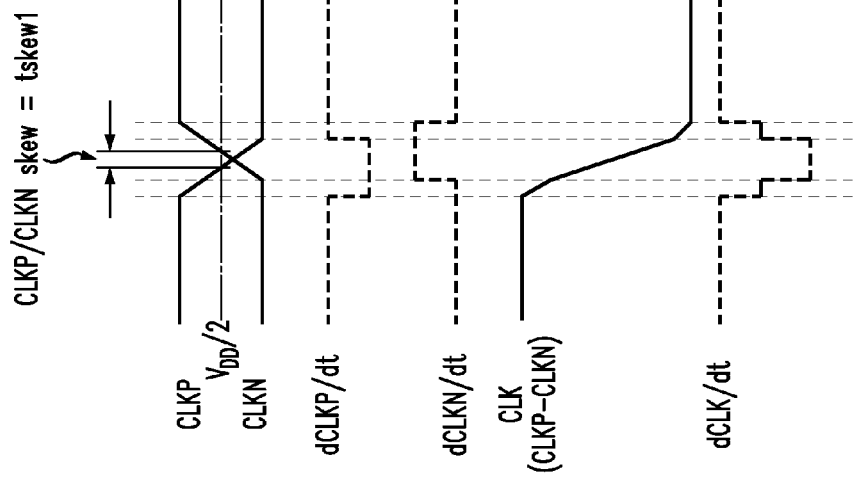
FIG. 4 illustrates the impact of a skew between the time instants at which the P rail and N rail signals cross the logic threshold.

FIG. 4 illustrates the impact of a time difference, or skew, between the time instants at which the P rail and N rail signals cross the logic threshold. In the presence of a skew, the P and N rails do not cross the exemplary voltage threshold of $V_{DD}/2$ at the same time. Over the time interval tskew1, both CLKP and CLKN are both less than the logic threshold and are coincidentally at the same logic level and form an invalid differential logic state. Without specific design precautions in the subsequent differential logic gates driven by this clock signal, the presence of a coincident logic level on both the P rail and N rail will cause unexpected and potentially improper subsequent logic gate behavior. In the presence of a time difference tskew1, it is also noted that the slope of CLKP and CLKN awe offset by the time difference tskew1. As a result, the slope of the differential waveform CLK is reduced at the initial and final portions of its transition. The total transition time of the differential waveform is therefore increased in the presence of skew between its P and N rails, which may cause a problem in the operation of subsequent logic.

Figure 5:
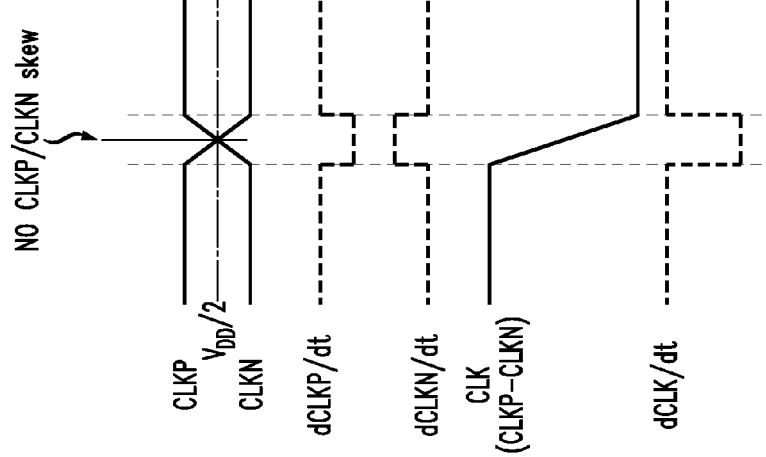
FIG. 5 illustrates the impact of a skew between the P and N rails of a differential waveform that is larger than the skew of FIG. 4.

FIG. 5 illustrates the impact of a skew, tskew2, between the P and N rails of a differential waveform that is larger than the skew, tskew1, in FIG. 4. In the more extreme case shown in FIG. 5, the value of tskew2 is significant relative to the transition time of the P and N rails and hence there is a region of time when both the P and N rail have reached the same logic state. Thus, the resulting differential waveform remains at the differential threshold of 0V for the period of time that its P and N rails are at a coincident logic state. In addition to potentially causing improper subsequent logic gate operation as a result of the coincident logic level of the P and N rails, this can significantly impact the sensitivity of the subsequent logic gates to any external disturbances (such as power supply noise, ground noise, capacitive coupling) as the waveform remains at the differential switching threshold for an extended period of time

Model of Differential Signal Skew and Propagation Delay Time

Figure 6:
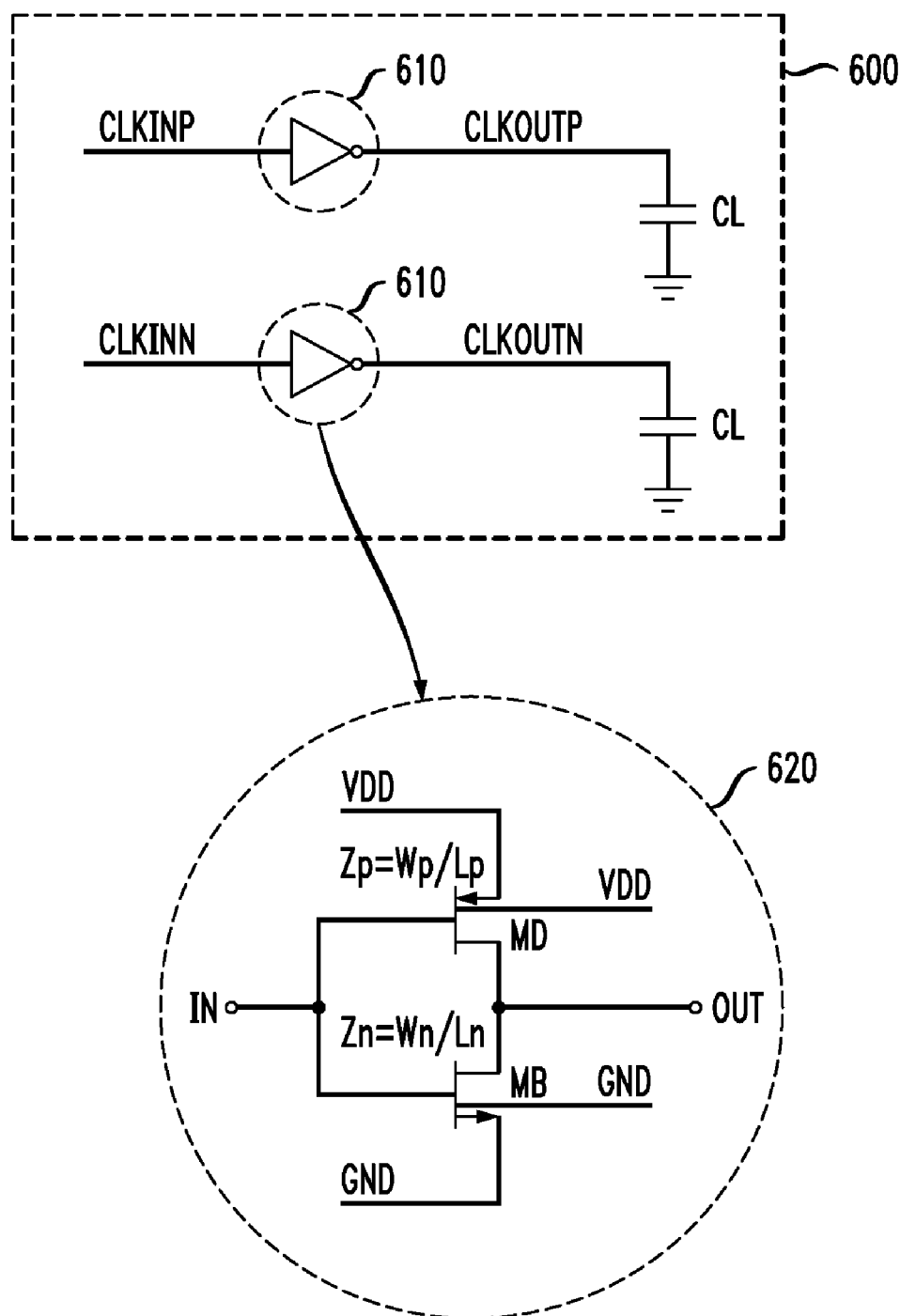
FIG. 6 illustrates a differential inverter comprised of a pair of CMOS inverters, each having an input differential signal CLKIN and an output differential signal CLKOUT.

FIG. 6 illustrates a differential inverter 600 comprised of a pair of CMOS inverters 610, each having an input differential signal CLKIN and an output differential signal CLKOUT. Each of the two inverters 610 of the differential inverter 600 can be embodied as a single-ended inverter 620 with a CMOS technology input IN and CMOS technology output OUT. As shown in FIG. 6, each inverter 620 consists of a p-channel device having an aspect ratio $Zp=Wp/Lp$ and an n-channel device with aspect ratio $Zn=Wn/Ln$ where:

Wp(n)=channel width of p-channel (or n-channel) MOS device; and

Lp(n)=channel length of p-channel (or n-channel) MOS device.

The values of Zp and Zn and the ratio of Zp/Zn are selected to achieve both the DC transfer characteristic requirements and transient response requirements for the inverter 620. For a typical CMOS inverter in silicon technology, the ratio Zp/Zn is between 2.5 and 5. When the input of the single-ended input signal IN proceeds from a CMOS logic low to a CMOS logic high, the output OUT transitions from a CMOS logic high to a CMOS logic low. In this case, the p channel device is turned off as its gate-source voltage is set to zero and the n-channel device is turned on with a gate-source voltage of typically the supply voltage $V_{DD}$. Analogously, when the input transitions from a CMOS logic high to a CMOS logic low, the p channel device is turned on with a gate-source voltage of the supply voltage $V_{DD}$ and the n-channel device is turned off with a gate-source voltage of 0.

Figure 7:
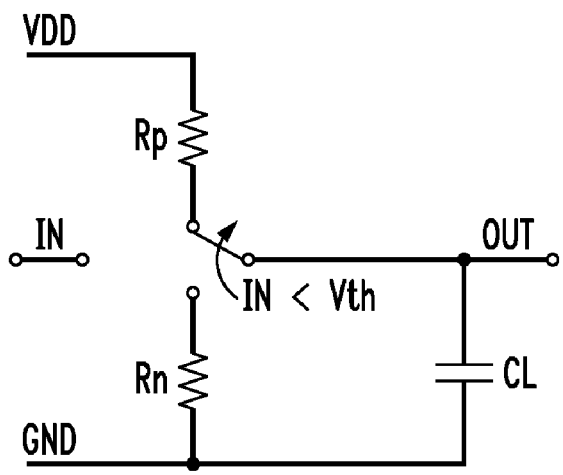
FIGS. 7 and 8 provide models of the CMOS inverter of FIG. 6 for transitions from a logic low value to a logic high value and from a logic high value to a logic low value, respectively.
Figure 8:
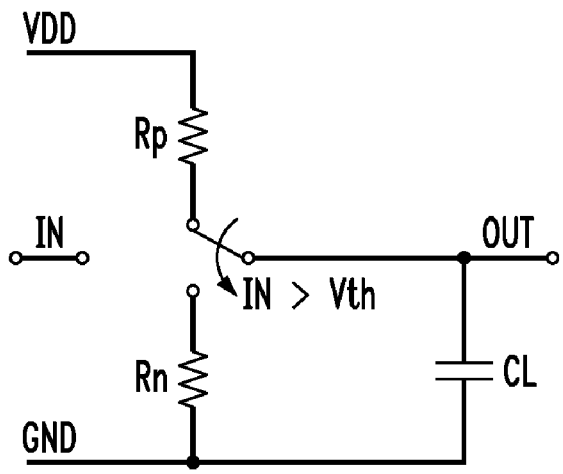

FIGS. 7 and 8 provide models 700 and 800 of the CMOS inverter of FIG. 6. FIG. 7 illustrates a transition from a logic low value to a logic high value FIG. 8 illustrates a transition from a logic high value to a logic low value. In FIGS. 7 and 8, the drain source resistance of the p-channel and n-channel MOS device is modeled as a resistor with value Rp and Rn, respectively. The load capacitance CL represents the capacitive load at the inverter output node.

Since the logic threshold of a well designed CMOS inverter is typically $V_{DD}/2$, the propagation delay times representing the time between an ideal input logic signal that transitions instantaneously and the time the output of the inverter crosses $V_{DD}/2$ may be calculated for both an output low to high ($\tau_{PLH}$) and output high to low transition ($\tau_{PHL}$). Equations 1 and 2 detail the relationship between each propagation delay, the load capacitance and the MOS p-channel or n-channel resistance $$\tau_{PLH} = RpCL \ln 2 \quad (1)$$

$$\tau_{PHL} = RnCL \ln 2 \quad (2)$$

Since a differential inverter 600 consists of an inverter 610 in series with the P and N rail of the differential input, the time differences or skew between the instant that the P output and the instant that the N output cross the output voltage threshold of $V_{DD}/2$ in response to a positive and negative differential input transition are computed in equations 3 and 4

$$\text{Skew}_{HL} = \tau_{PHL} - \tau_{PLH} = [Rn-Rp]*CL*\ln 2 \quad (3)$$

$$\text{Skew}_{LH} = \tau_{PLH} - \tau_{PHL} = [Rp-Rn]*CL*\ln 2 \quad (4)$$

Figure 9:
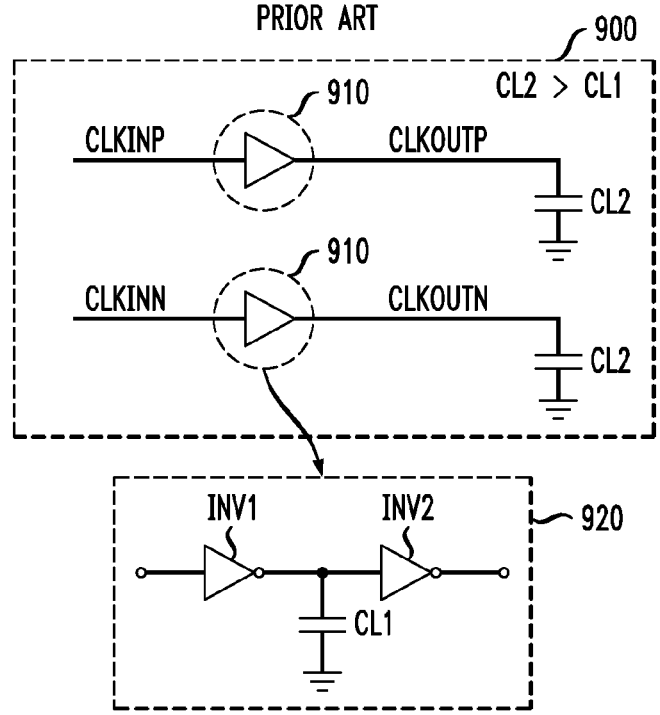
FIG. 9 illustrates an exemplary differential buffer topology.

FIG. 9 illustrates an exemplary differential buffer topology 900. The differential buffer topology 900 consists of two series connected differential inverters 910. A differential buffer stage 900 is often used as a regenerator section to restore the signal integrity of a differential signal. Referring to FIG. 9, the internal differential buffer load capacitances CL1 are usually much less than the buffer load capacitances CL2. As a result, the channel width (or size) of the CMOS devices 920 in the output inverter INV2, are larger than those of the input inverter INV1.

The propagation delay time of the differential buffer 900 may be estimated by using the propagation delay times of a CMOS inverter determined in the following equations 5 and 6. This analysis requires that the transition time of the input waveform to INV2 is significantly less than its output transition time and may not always be a valid approximation. However, in most applications, this condition is satisfied. The resulting output low-to-high and output high-to-low propagation delay estimates for each trail are:

$$\tau_{PLH} = \tau_{PLH1} + \tau_{PLH2} = [Rn_1 CL1 + Rp_2 CL2]*\ln 2 \quad (5)$$

$$\tau_{PHL} = \tau_{PLH1} + \tau_{PHL2} = [Rp_1 CL1 + Rn_2 CL2]*\ln 2 \quad (6)$$

The differential waveform low-to-high and high-to-low skews are estimated as:

$$\text{Skew}_{LH} = \tau_{PLH} - \tau_{PHL} = [Rn_1 CL1 + Rp_2 CL2 - Rp_1 CL1 - Rn_2 CL2]*\ln 2 \; [(Rn_1-Rp_1)CL1 + (Rp_2-Rn_2)CL2] *\ln 2 \quad (7)$$

$$\text{Skew}_{LH} = \tau_{PHL} - \tau_{PLH} = [Rp_1 CL1 + Rn_2 CL2 - Rn_1 CL1 - Rp_2 CL2]*\ln 2 \; [(Rp_1-Rn_1)CL1 + (Rn_2-Rp_2)CL2] *\ln 2 \quad (8)$$

In any silicon process, the value of the n-channel and p-channel resistances are uncorrelated. In addition, in many applications, the value of the load capacitance CL2 is much greater than the internal load capacitance CL1. Hence, the skew of the differential buffer shown in FIG. 9 is typically non-zero. With silicon process variation and environmental changes, a significant variation in its propagation delays and skew are observed.

Differential Buffer Strategies to Attenuate Differential Input Skew

Enforcer Style Differential Buffer

If there is differential skew on the differential input signal applied to a buffer, the output differential skew will be a combination of the input differential skew and the inherent skew of the buffer defined in equations 7 and 8.

Figure 10:
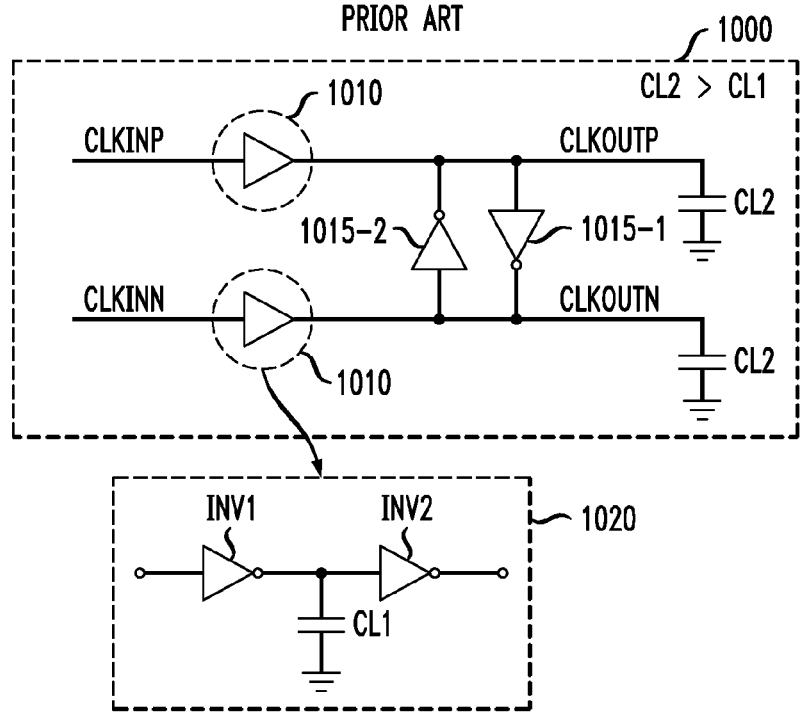
FIG. 10 illustrates an exemplary implementation of a conventional "enforcer" style differential buffer topology.

To reduce the impact of the combination of differential input skew and the inherent skew of a differential buffer, a common technique is to place a CMOS inverter between the P and N rails and a second CMOS inverter between the N and P outputs of the differential buffer as shown in FIG. 10. In this fashion, if the output rails CLKOUTP and CLKOUTN are at the same CMOS logic level (corresponding to the presence of output differential skew), the differential rails are driven to opposite logic states after the low-to-high (outputs both at a CMOS logic low) or high-to-low (outputs both at a CMOS logic high) propagation delay of the added inverters. Since the size of the added inverters are typically smaller than the size of the output stage of the differential inverter, the time at which the transitions in CLKOUTP and CLKOUTN occur are governed by the relative size of the added inverters.

FIG. 10 illustrates an exemplary implementation of a conventional "enforcer" style differential buffer topology 1000. As shown in FIG. 10, the "enforcer" style differential buffer topology 1000 comprises a first relatively small CMOS inverter 1015-1 with its input to the P rail and its output to the N rail of an output of a differential buffer 1010 and a second small CMOS inverter 1015-2 with its input to the N rail and its output to the P rail of the same differential buffer output 1010. The CMOS buffers 1010 can be implemented using the exemplary CMOS circuitry 1020.

Figure 11:
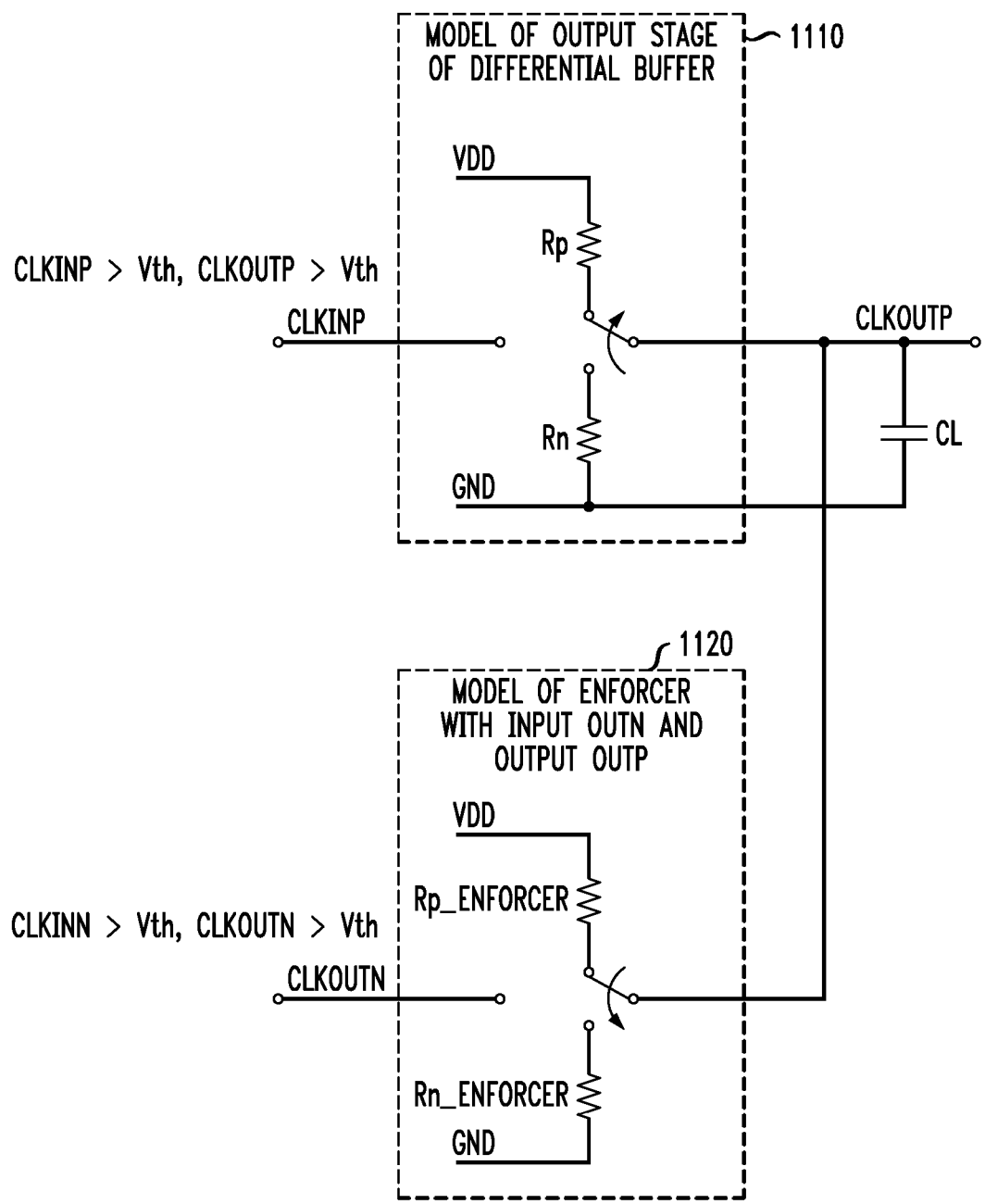
FIG. 11 illustrates a model of the P rail output, CLKOUTP, of the enforcer style differential buffer of FIG. 10, where the differential input signals, CLKINP and CLKINN, are both at a logic high state (skewed condition)

FIG. 11 illustrates a model of the P rail output, CLKOUTP, of the enforcer style differential buffer 1000 of FIG. 10, where the differential input signals, CLKINP and CLKINN, are both at a logic high state (skewed condition). As shown in FIG. 11, the overall model comprises a model 1110 of the output stage of the differential buffer 1010, and a model 1120 of the enforcer buffer 1015-2 with an input OUTN and an output OUTP. With reference to FIG. 11, the impact of the enforcer buffer when the two rails of the differential buffer are at the same logic level can be considered. With differential buffer input rails CLKINP and CLKINN at a CMOS logic high (i.e., exceeding $V_{th}$), the output P rail of the differential buffer, CLKOUTP, is driven to a logic high by the differential buffer through the output resistance Rp. With CLKINN also at a logic high, the input to the inverter enforcer, CLKOUTN, is at a logic low value.

$$CLKOUTP(CLKINP > Vth, CLKINN > Vth) = \qquad (9)$$
$$VDD * \left[ \frac{Rn\_enforcer}{Rn\_enforcer + Rp} \right]$$

$$\text{For } CLKOUTP \leq Vth \text{ and } CLKOUTN \geq Vth: \quad \begin{matrix} Rn\_enforcer \leq Rp \\ Rp\_enforcer \leq Rn \end{matrix} \qquad (10)$$

As detailed in equations (9) and (10), in the presence of input skew that causes the two input rails CLKINP and CLKIN to be at the same logic state, the enforcer inverter will only disallow the two output rails to be at the same logic level if Rn_enforcer≦Rp and Rp_enforcer≦Rn. With Rn_enforcer equal to Rp, the output P rail CLKOUTP will be at a logic low (the opposite logic state as CLKINP) and with Rp_enforcer≦Rn, the output rail CLKOUTN will be at a logic high state. Similarly, output rail CLKOUTN will be at the same logic level as CLKINN and differential output skew will be present at the differential buffer output rails CLKOUTP and CLKOUTN.

Figure 12:
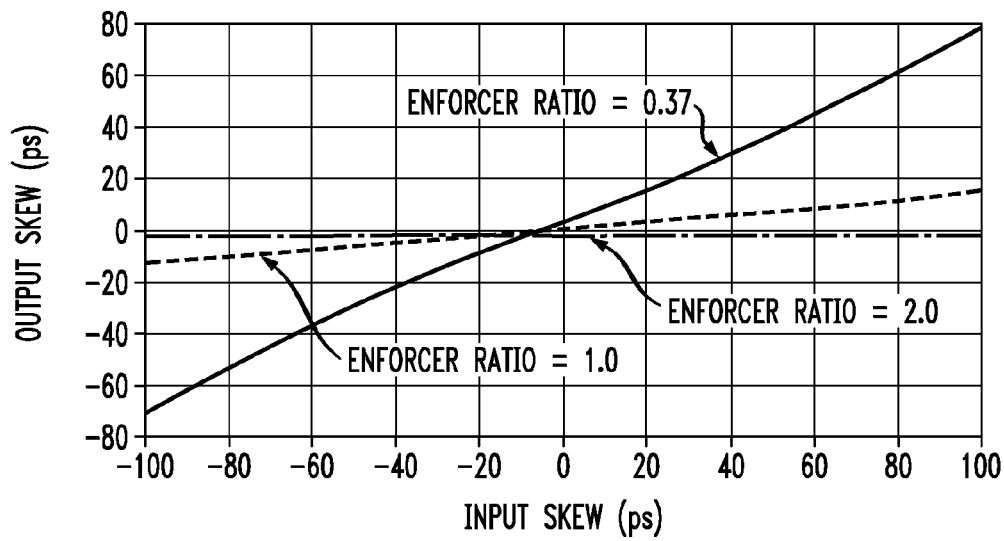
FIG. 12 illustrates an exemplary differential output skew as a function of the input skew for an exemplary "enforcer" style differential buffer topology with various enforcer ratios.

FIG. 12 illustrates an exemplary differential output skew as a function of the input skew for an exemplary "enforcer" style differential buffer topology 1000 with an enforcer ratio (size of CMOS inverter 1015, relative to size of buffer 1010) of 0.37, 1.0 and 2.0 in response to an input skew between −100 ps and +100 ps under typical silicon process and environmental conditions. For an enforcer ratio of 0.37 and 1.0, the differential output skew appears significantly more dependent on the input skew than with an enforcer ratio of 2.0. It has been observed that to achieve a significant amount of input skew attenuation, the use of an enforcer ratio of greater than 1.0 is necessary.

However, as the size of the enforcer inverters is increased, the differential buffer power dissipation and its transient current requirements are increased. A further undesirable side effect of the increased enforcer ratio is the increase in the peak supply current with enforcer ratio as this results in additional supply noise. Hence, to attenuate significant amounts of differential input skew with the use of an enforcer style differential buffer, the enforcer ratio must be on the order of 2.0, and an increase in both supply current and supply noise must be tolerable.

Skew Attenuating Differential Buffer

Figure 13:
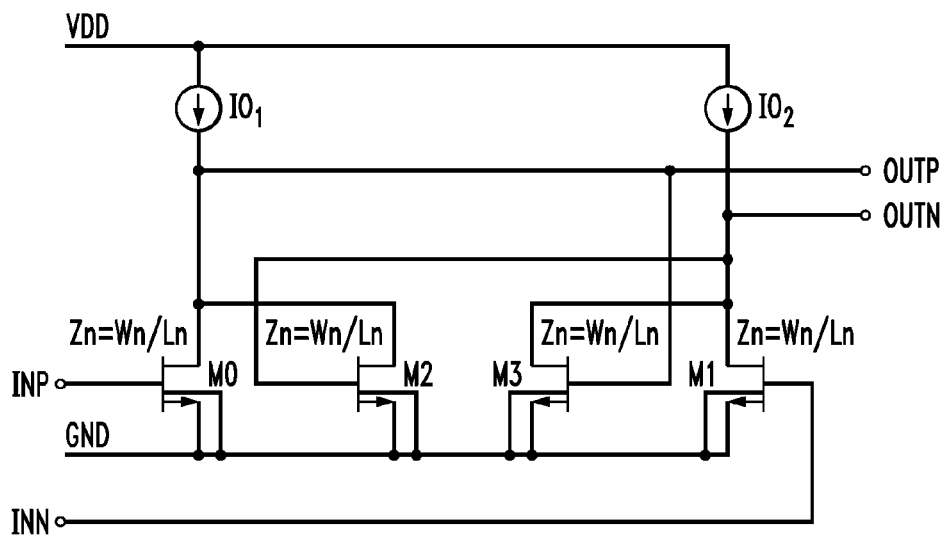
FIG. 13 is a schematic diagram of a differential inverter-based skew attenuator incorporating features of the present invention.

FIG. 13 is a schematic diagram of a differential inverter-based skew attenuator 1300 incorporating features of the present invention. In the circuit topology shown in FIG. 13, the differential input signal is applied to devices M0 and M1 at input nodes INP and INN, and the differential output is taken at outputs OUTP and OUTN. In addition, the differential inverter-based skew attenuator 1300 includes two n-channel devices M2 and M3 that provide feedback between the two output signals OUTP and OUTN to the nodes OUTN and OUTP, respectively. A first current source I0$_1$ feeds the drains of M0 and M2, and a second current source I0$_2$ supplies the drains of M1 and M3.

The circuit formed by devices M0, M1, M2, M3 and current sources I01 and I02 may be implemented using NMOS or PMOS devices commonly found in a non-complementary logic family. A non-complementary device is a logic family having a conducting load. As used herein, a non-complementary inverter comprises an NMOS or a PMOS device having a drain connected to a current source or a resistive load.

Figures 14, 15:
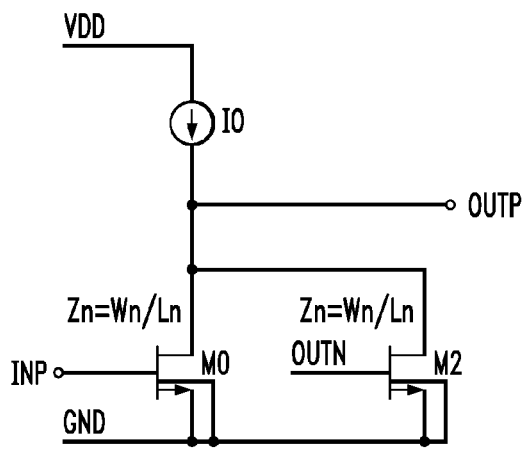
FIG. 14 illustrates a half-circuit of the differential inverter based skew attenuator of FIG. 13.
FIG. 15 is a table identifying the output logic levels of the signal CLKOUTP of the differential inverter-based skew attenuator of FIG. 13 as a function of the input logic states of CLKINP and CLKINN.

FIG. 14 illustrates a half-circuit 1400 of the differential inverter based skew attenuator 1300 of FIG. 13. The half-circuit 1400 illustrates the operation of the differential inverter 1300. As shown most clearly in FIG. 13, if the two rails of the differential input signal INP and INN are at complementary logic levels, the signals OUTP and OUTN will also be at complementary logic levels and (OUTP-OUTN) is at the opposite differential logic state as the input differential signal (INP-INN). The logic state of INP and the logic state of OUTN are identical, and hence devices M0 and M2 are either fully saturated or in their off state. When fully saturated, each device M0 and M2 has a drain resistance to ground of Rn and there is a net drain resistance of Rn/2 between the node OUTP and ground. Thus, when there is no skew, the voltage drop across the drain of devices M0 and M2 is I0(Rn/2), to thereby quickly pull OUTP to a low logic level.

If the input signal has a differential skew, and INP transitions to the current logic state of INN before a complementary transition occurs on logic signal INN, signal OUTN is at the opposite logic state as INP. Therefore, device M0 and device M2 will also be at opposite logic states (either M0 is saturated and M2 is in its off state or M0 is in its off state and device M2 is fully saturated). As a result, there is always a net resistance from node OUTP to ground of Rn. The presence of this resistance prevents the output OUTP from transitioning fully to the opposite logic state, and hence effectively prevents the two rails of the output differential signal OUTP and OUTN from being at the same logic state for a period of time. When there is skew, the voltage drop across the drain of devices M0 and M2 is I0(Rn). This property allows the differential inverter to effectively attenuate a limited amount of differential skew on the signal applied to its differential input.

For example, in the presence of a skew, if the input INP transitions from a logic low value to a logic high value, before the input INN transitions from a logic high value to a logic low value, the two input signals will both be at a logic high value for a lead interval. During this lead interval, the transition on INP will enable device M0 (modeled as a resistor, Rn) causing the node OUTP to come down to a low logic value of I0Rn. Likewise, this new low logic value of OUTP (I0Rn) at the gate of device M3 will cause the device M3 to operate as an open circuit and thereby pull up the value of OUTN during this lead interval to an intermediate value of $V_{DD}$-I0Rn. When the input INN finally transitions from a logic high value to a logic low value, then the transition will cause device M1 to act as an open circuit (in parallel with the open circuit of device M3) causing the output OUTN to come up to a full logic high value of $V_{DD}$. Likewise, the new high logic value of OUTN will cause the device M2 to operate as a resistor (in parallel with the resistor model of device M0) and thereby pull down the value of OUTP to a value of I0Rn or I0Rn/2.

FIG. 15 is a table 1500 identifying the output logic levels of the signal CLKOUTP of the differential inverter-based skew attenuator 1300 as a function of the input logic states of CLKINP and CLKINN. The first row of the table 1500 illustrates the specific property of the buffer that provides its skew attenuation capability.

Figure 16A:
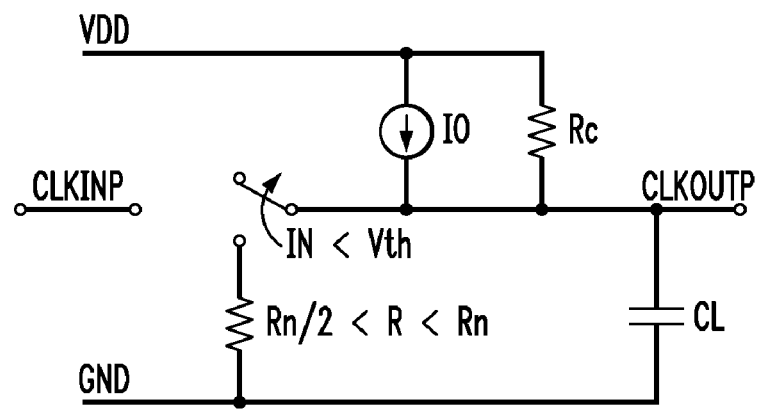
FIGS. 16A and 16B illustrate half-circuit models of the differential inverter based skew attenuator of FIG. 13.
Figure 16B:
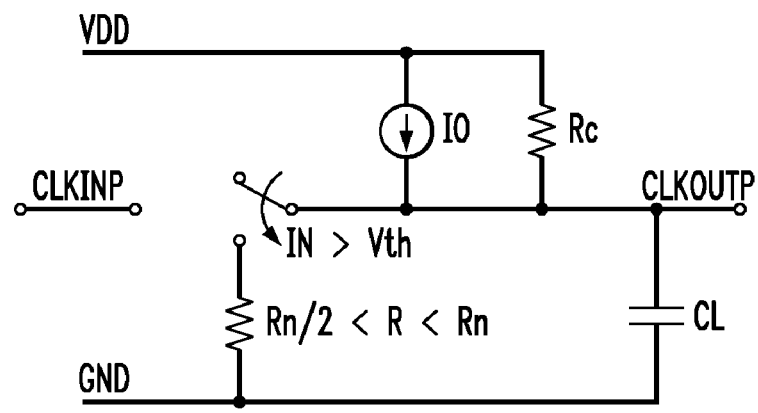

FIGS. 16A and 16B illustrate half-circuit models of the differential inverter based skew attenuator 1300 of FIG. 13. FIG. 16A is the half-circuit model 1600 when the input is below the threshold, and FIG. 16B is the half-circuit model 1650 when the input is above the threshold. Using the logic threshold of $V_{DD}/2$, the propagation delay time between an ideal input logic signal that transitions instantaneously and the time the output of the inverter crosses $V_{DD}/2$ may be estimated for this differential inverter 1300 for both an output low to high ($\tau_{PLH}$) and output high to low transition ($\tau_{PHL}$) using the simplified half circuit models shown in FIGS. 16A and 16B when the device resistance R equals Rn/2 (corresponding to a zero differential input skew). For the period of time when differential input skew is present, the value of R is set to Rn (and not Rn/2).

Equations 11 and 12 detail the relationship between each propagation delay, the load capacitance, the bias current I0 and the MOS n-channel resistance with R=Rn/2.

$$\tau_{PLH} = \frac{RnCL}{2}\left(\frac{VDD}{I0Rn} - 1\right) \quad (11)$$

$$\tau_{PHL} = \frac{RnCL}{2}\left(\ln\left(1 + \left[\frac{\frac{VDD}{I0Rn}}{\frac{VDD}{I0Rn} - 1}\right]\right)\right) \quad (12)$$

A significant difference in the propagation delays for the skew attenuating differential inverter is observed when compared to those for the enforcer based inverter in equations 1 and 2. The value of Rp and Rn in equations 1 and 2 are highly dependent on the value of supply voltage. Therefore, any modulation of the voltage between the supply voltage and ground will result in a modulation in each propagation delay. However, in the expressions for propagation delay for the skew attenuating inverter of the present invention, the sensitivities of the propagation delays to $V_{DD}$ are dependent on the sensitivity of Rn and I0. The propagation delay's dependence on $V_{DD}$ is independent of a p-channel device's "on" resistance to the extent that the output impedance of I0 is independent of $V_{DD}$.

When the variation in the two sets of propagation delays under typical silicon process conditions are compared, as the supply voltage is varied from 1.0 V to 1.30 V, it can be shown that the rising edge propagation delay which is most dependent on the p-channel output resistance, has a greater sensitivity to $V_{DD}$ in the enforcer style differential buffer than the skew attenuating differential buffer of the present invention. The differential skew between the instant that the P output and the instant that the N output cross the output voltage threshold of $V_{DD}/2$ in response to a positive and negative differential input transition is computed in equation 13. Since the design of the inverter will require that the logic low level of I0*Rn/2 be close to ground, the value of $V_{DD}/(I0*Rn)$ must be significantly greater than 1, and hence the output skew may be approximated by the expressions in equations 14 and 15.

$$Skew_{HL} = \tau_{PHL} - \tau_{PLH} \quad (13)$$

$$= \frac{RnCL}{2}\left(\ln\left(1 + \left[\frac{\frac{VDD}{I0Rn}}{\frac{VDD}{I0Rn} - 1}\right]\right)\right) - \frac{RnCL}{2}\left(\frac{VDD}{I0Rn} - 1\right)$$

$$Skew_{HL} \approx \frac{RnCL}{2}\left(\ln 2 + \left(1 - \frac{VDD}{I0Rn}\right)\right) \quad (14)$$

$$Skew_{LH} = \tau_{PLH} - \tau_{PHL} \approx \frac{RnCL}{2}\left(\ln 2 + \left(1 - \frac{VDD}{I0Rn}\right)\right) \quad (15)$$

It has also been observed that the skew of an enforcer style differential buffer exhibits a greater supply dependence than the skew attenuating buffer topology of the present invention for supply voltages greater than about 1.05 V.

Figure 17:
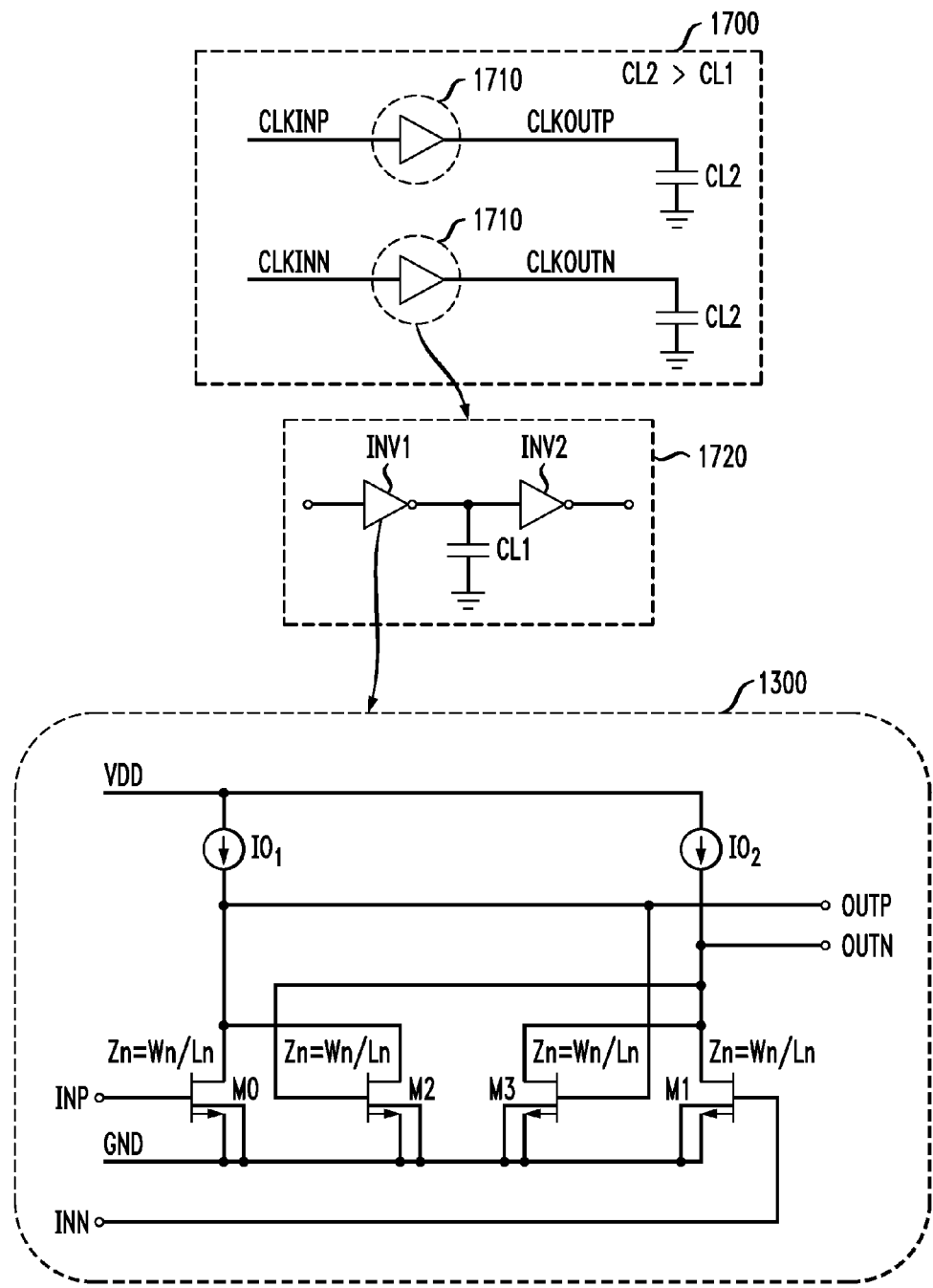
FIG. 17 illustrates a skew attenuating differential buffer in accordance with the present invention.

FIG. 17 illustrates a skew attenuating differential buffer 1700 in accordance with the present invention. As shown in FIG. 17, the skew attenuating differential buffer 1700 may be formed using this style of differential inverter by a cascade 1720 of two differential inverters INV1 and INV2. To minimize the input capacitance of the buffer, the first differential inverter, shown as INV1 in FIG. 17, is chosen to have smaller devices than the second differential inverter INV2. The size of devices in INV2 is chosen to drive the required load capacitance and provide the desired amount of skew attenuation.

Figure 18:
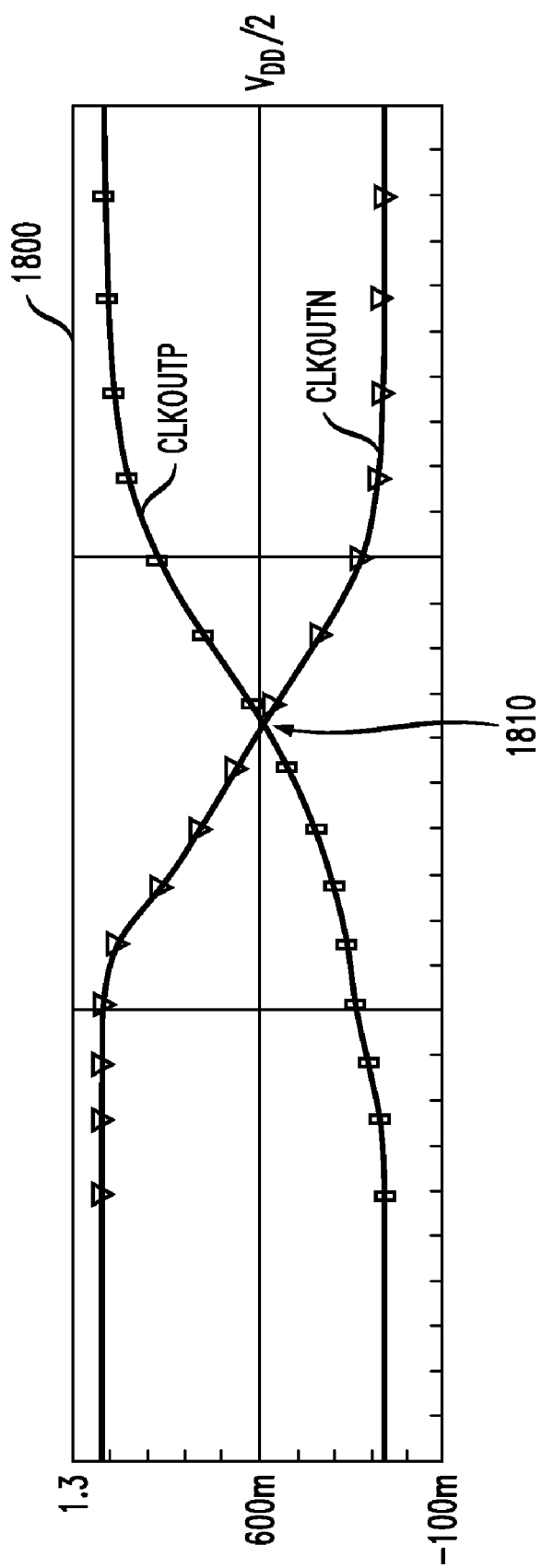
FIG. 18 illustrates the P and N rails of the differential output waveform for an exemplary differential inverter-based skew attenuator of FIG. 13.

FIG. 18 illustrates the P and N rails of the differential output waveform 1800 for an exemplary differential inverter-based skew attenuator 1300. As shown in FIG. 18, both rails transition at a transition point 1810 and a voltage threshold of $V_{DD}/2$. Generally, the differential inverter-based skew attenuator 1300 attenuates a limited amount of differential skew by initially slowing the transition during the interval when only one device is active (M0 and M2) and then the slope changes as the second device of M0 and M2 become active.

It has been observed that the magnitude of the transient current is much less in the disclosed skew attenuating buffer than in the conventional enforcer style differential buffer.

A comparison of the two buffer styles that possess similar skew attenuating characteristics (i.e., the disclosed skew attenuating buffer and the enforcer style buffer with an enforcer ratio of 2.0) suggests that the output phase jitter of the enforcer style differential buffer is significantly greater in response to supply and ground noise than the skew attenuating buffer. Further, as the input skew to the skew attenuating buffer is reduced, its output phase jitter is significantly reduced. Although the output phase jitter of the enforcer style differential buffer with an enforcer ratio of 0.37 and 1.0 may have a lower sensitivity to supply and ground noise than an enforcer style differential buffer with an enforcer ratio of 2.0, it has a very limited ability to attenuate input skew and hence may not provide proper circuit operation over the range of input skew illustrated.

It appears that the peak-to-peak output jitter of the enforcer style buffer with an enforcer ratio of 2.0 exceeds that of the skew attenuating buffer by a factor of 3 or more when the input skew is less than ±50 ps. The additional reduction in peak-to-peak output jitter of the skew attenuating buffer is a result of the high frequency power supply rejection of the bias current I0 supplied to the buffer.

To provide near equivalent skew attenuating performance between the two topologies, an enforcer style differential buffer must have an enforcer ratio of 2.0. However, the output phase jitter of the enforcer based differential buffer with an enforcer ration of 2.0 shows a much higher sensitivity to supply and ground noise than the skew attenuating differential buffer topology. Although the rms supply current of the enforcer style differential buffer is less than the skew attenuating buffer topology, its supply current characteristic will result in greater supply and ground noise due to its significantly higher peak-to-rms ratio.

In summary, the use of a skew attenuating differential buffer topology provides skew attenuation of up to ±500 ps of input skew while providing significantly less sensitivity to supply and ground noise and less CMOS switching noise on the power supply node than a differential buffer with enforcers at the expense of a greater value of rms supply current. The impact of the additional rms value of supply current may be warranted in high performance applications.

A plurality of identical die are typically formed in a repeated pattern on a surface of a wafer. Each die includes a device described herein, and may include other structures or circuits. The individual die are cut or diced from the wafer, then packaged as an integrated circuit. One skilled in the art would know how to dice wafers and package die to produce integrated circuits. Integrated circuits so manufactured are considered part of this invention.

It is to be understood that the embodiments and variations shown and described herein are merely illustrative of the principles of this invention and that various modifications may be implemented by those skilled in the art without departing from the scope and spirit of the invention.

I claim:

1. An apparatus including a skew attenuator for a differential signal having a P rail and an N rail, comprising:
   one or more non-complementary inverters for compensating for skew between said P rail and said N rail, wherein said non-complementary inverter comprises one or more of an NMOS and a PMOS device having a drain connected to a current source or a resistive load.

2. The apparatus of claim 1, wherein said one or more non-complementary inverters comprises a current source driving one or more of NMOS devices and PMOS devices.

3. The apparatus of claim 2, wherein said current source is applied to a drain of said one or more of NMOS devices and PMOS devices.

4. The apparatus of claim 1, wherein said one or more non-complementary inverters comprises a resistive load connected to a drain of one or more of NMOS devices and PMOS devices.

5. The apparatus of claim 1, further comprising a first non-complementary inverter associated with each of said P rail and said N rail, wherein said P rail and said N rail signals are each applied to a gate of one of said first non-complementary inverters, and a drain of said first non-complementary inverters provide differential output signals OUTP and OUTN.

6. The apparatus of claim 5, further comprising an additional non-complementary inverter associated with each of said first non-complementary inverters, wherein said additional non-complementary inverters have a gate connected to said differential output signals for an opposite rail and a drain connected to said differential output signals for a same rail, wherein a first of said additional non-complementary inverter provides feedback between the output signal OUTP to a node OUTN and wherein a second of said additional non-complementary inverter provides feedback between the output signal OUTN to a node OUTP.

7. The apparatus of claim 5, further comprising an additional non-complementary inverter associated with each of said first non-complementary inverters, wherein an inverted version of an opposite one of said P rail and said N rail signals is applied to a gate of each of said additional non-complementary inverters such that a first of said additional non-complementary inverter provides feedback between the output signal OUTP to a node OUTN and wherein a second of said additional non-complementary inverter provides feedback between the output signal OUTN to a node OUTP.

8. The apparatus of claim 7, wherein said inverted version is an output of an opposite one of said P rail and said N rail signals.

9. The apparatus of claim 5, wherein a combination of one of said first non-complementary inverters and one of said additional non-complementary inverters provides output logic levels that satisfy predefined requirements for logic high and logic low values.

10. The apparatus of claim 1, wherein said one or more non-complementary inverters attenuates a time difference of arrival of transitions for said P rail and said N rail.

11. The apparatus of claim 1, wherein said skew attenuator is embodied as an integrated circuit.

12. A method for compensating for skew between a P rail and an N rail of a differential signal, comprising:
   applying one or more of said P rail and N rail signals to one or more non-complementary inverters to attenuate said skew, wherein said non-complementary inverter comprises one or more of an NMOS and a PMOS device having a drain connected to a current source or a resistive load.

13. The method of claim 12, wherein said one or more non-complementary inverters comprises a current source driving one or more of NMOS devices and PMOS devices.

14. The method of claim 13, further comprising the step of applying said current source to a drain of said one or more of NMOS devices and PMOS devices.

15. The method of claim 12, wherein said one or more non-complementary inverters comprises a resistive load connected to a drain of one or more of NMOS devices and PMOS devices.

16. The method of claim 12, further comprising the step of applying each of said P rail and said N rail signals to a gate of a corresponding first non-complementary inverter, and wherein a drain of said first non-complementary inverters provide differential output signals OUTP and OUTN.

17. The method of claim 16, further comprising the steps of providing feedback between the output signal OUTP to a node OUTN using an additional non-complementary inverter associated with a first of said first non-complementary inverters and providing feedback between the output signal OUTN to a node OUTP using an additional non-complementary inverter associated with a second of said first non-complementary inverters, wherein said additional non-complementary inverters have a gate connected to said differential output signals for an opposite rail and a drain connected to said differential output signals for a same rail.

18. The method of claim 17, further comprising the step of applying an inverted version of an opposite one of said P rail and said N rail signals to a gate of each of said additional non-complementary inverters.

19. The method of claim 18, wherein said inverted version is an output of an opposite one of said P rail and said N rail signals.

20. A skew attenuator for a differential signal having a P rail and an N rail, comprising:
   a first non-complementary inverter associated with each of said P rail and said N rail, wherein each of said first non-complementary inverters comprise an NMOS or a PMOS device having a drain connected to a conductive load, wherein said P rail and said N rail signals are each applied to a gate of one of said first non-complementary inverters, and a drain of said first non-complementary inverters provide differential output signals OUTP and OUTN; and
   an additional non-complementary inverter associated with each of said first non-complementary inverters, wherein said additional non-complementary inverters have a gate connected to said differential output signals for an opposite rail and a drain connected to said differential output signals for a same rail, wherein a first of said additional non-complementary inverter provides feedback between the output signal OUTP to a node OUTN and wherein a second of said additional non-complementary inverter provides feedback between the output signal OUTN to a node OUTP.

* * * * *